(12) United States Patent
Marchese et al.

(10) Patent No.: US 6,271,688 B1
(45) Date of Patent: Aug. 7, 2001

(54) MOS TRANSCONDUCTOR WITH BROAD TRIMMING RANGE

(75) Inventors: Stefano Marchese, Pavia; Giacomino Bollati, Castel San Giovanni; Maurizio Malfa, Pontenuovo Magenta; Pierandrea Savo, Pavia, all of (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/596,510

(22) Filed: Jun. 19, 2000

(30) Foreign Application Priority Data

Jul. 17, 1999 (EP) .................................................. 99830379

(51) Int. Cl.$^7$ ...................................................... H03K 5/22
(52) U.S. Cl. ............................. 327/65; 327/563; 330/253
(58) Field of Search ............................... 327/65, 89, 359, 327/552, 563; 330/253, 258

(56) References Cited

U.S. PATENT DOCUMENTS

| | | | |
|---|---|---|---|
| 4,568,885 | * | 2/1986 | McKenzie et al. .................. 330/253 |
| 4,573,020 | * | 2/1986 | Whatley ............................... 330/258 |
| 5,384,501 | * | 1/1995 | Koyama et al. ..................... 330/253 |
| 5,642,077 | | 6/1997 | Nagaraj ............................... 330/253 |
| 5,642,078 | | 6/1997 | Navabi et al. ....................... 330/253 |

FOREIGN PATENT DOCUMENTS 93830284.1    6/1993  (EP) .

OTHER PUBLICATIONS

Visocchi et al., "Fully Balanced Tunable GaAs MESFET OTA–C Integrator Suitable for High Precision Filtering Applications", Mar. 12, 1992, pp. 537–539.

* cited by examiner

Primary Examiner—Kenneth B. Wells
Assistant Examiner—Paul Dinh
(74) Attorney, Agent, or Firm—Theodore E. Galanthay; Allen, Dyer, Doppelt, Milbrath & Gilchrist, P.A.

(57) ABSTRACT

A transconductor includes a differential stage formed by a pair of input transistors, and a resistive line of degeneration connecting the sources of the input transistors. A bias current generator is coupled between the source of each input transistor and ground. The resistive line of degeneration is formed by one or more transistors connected in series, the gates of which are coupled to a voltage reference. The voltage reference is at least equal to the common mode voltage of the differential stage. The one or more transistors forming the resistive line of degeneration are sized to operate in the triode region.

28 Claims, 3 Drawing Sheets

MOS TRANSCONDUCTOR WITH BROAD TRIMMING RANGE

FIELD OF THE INVENTION

The present invention relates to integrated electronic circuits, and, more particularly, to a time-continuous analog filter with a programmable cut off frequency.

BACKGROUND OF THE INVENTION

The time constants of integrated systems have been traditionally implemented using transconductors and capacitors (T=C/gm). Cut off programmability is achieved by controlling the transconductance gain gm. FIG. 1 shows a typical CMOS differential transconductor for which the following equations apply:

$$ID = 1/2 * u * Cox * W/L * Vod^2 \quad (1)$$

where:

$$Vod = VGS - VTH$$

$$gm = dID/dVGS = u * Cox * W/L * Vod \quad (2)$$

where:
- ID is the drain current
- u is the nobility
- Cox is the specific capacitance of the oxide
- W is the channel width
- L is the channel length
- Vod is the so-called "overdrive" voltage of a MOS transistor For a given transistor's dimensioning (W/L), the maximum value of the transconductance gain gm is limited by the fact that the overdrive voltage Vod of the differential stage cannot exceed a certain value. Otherwise, the bias current generator of the stage could be turned off. In contrast, the minimum value of the current gain gm is limited by the fact that if the overdrive voltage Vod decreases the same amplitude of the input signal, the distortion that is introduced on the output current delivered by the transconductor stage increases.

The current output by the transconductor is directly proportional to the input voltage Vin only if such current is relatively small if compared to the overdrive voltage Vod. The distortion caused by the transconductor at relatively low values of the overdrive voltage Vod may be reduced by introducing, for this purpose, a number of degeneration resistors, as shown in FIG. 2.

By defining gm1 as the transconductance of the single input MOS transistor, the stage transconductance may be expressed as:

$$gm = gm1/(1 + R * gm1) \quad (3)$$

In the known structure of FIG. 2, part of the input signal drops due to the degeneration resistance. Therefore, for the same amplitude of the input signal, the voltage vgs between the gate and the source has a reduced range and a reduced distortion, according to the expression:

$$vgs = vi * 1/gm(R + 1/gm) \quad (4)$$

$$= vi/(1 + R * gm)$$

For the same absorbed power and overdrive, a greater linearity is obtained at the expense of a lower transconductance gain.

A disadvantage of this known structure is that the transconductance attenuation caused by the source degeneration resistance, introduced to improve the linearity at low overdrive levels, increases as the overdrive voltage increases. The result is a reduction of the trimming range of the circuit.

SUMMARY OF THE INVENTION

In view of the foregoing background, it is therefore an object of the present invention to overcome the above described limitations and drawbacks of the known differential transconductor circuits.

This and other objects, features and advantages in accordance with the present invention are provided by a degeneration resistance that decreases upon increasing the overdrive voltage. At high overdrive voltage values, there are less distortion problems, and thereby, a lower degree of degeneration is acceptable.

A resistive degeneration line includes one or more transistors in series that are sized to function in a so-called triode region of their characteristic, i.e., the nonsaturated region or ohmic region. The gate of the one or more transistors used to form the resistive line of source degeneration of the differential pair of input transistors may be, according to a first embodiment, coupled to the common voltage mode of the differential stage so that the transistor(s) may function with the same gate/source voltage (vgs) of the differential pair of input transistors.

As long as the drain-source voltage of the degeneration transistors remains lower than the overdrive voltage Vod, they function in the triode region by operating like resistances with a value defined by 1/gds. The drain-source conductance is defined by gds. The degeneration ratio is maintained constant irrespectively of the technological parameters, i.e., the spread of the fabrication process.

According to an alternative and preferred embodiment, which further extends the trimming range of the transconductance stage, the gates of the one or more transistors used to form the resistive line of source degeneration of the differential pair of input transistors are biased by a dedicated circuit. By injecting across a resistance R of the bias circuit to the gate of the one or more transistors used to form the resistive line of source degeneration, a current proportional to the bias current of the differential pair provides a degeneration resistance proportional to $1/(Vod + k * Vod^2)$, where $k = (R * u * Cox/2) * (W1/L1)$.

DETAILED DESCRIPTION OF THE PREFERRED EMBODIMENTS

Figure 2:
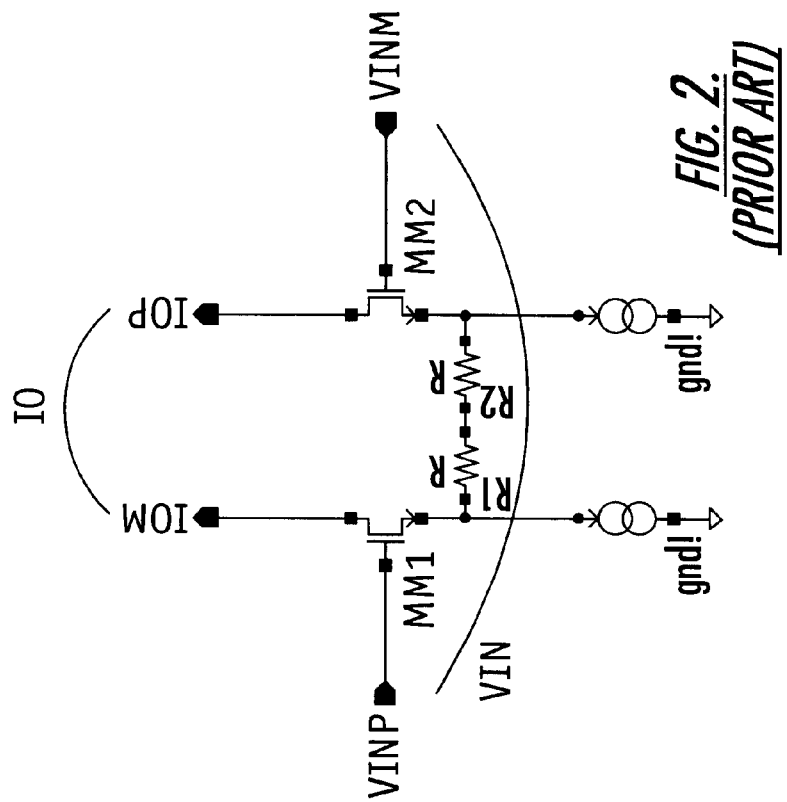
FIGS. 1 and 2 respectively represent basic schemes of a MOS transconductor according to the prior art.
Figure 1:
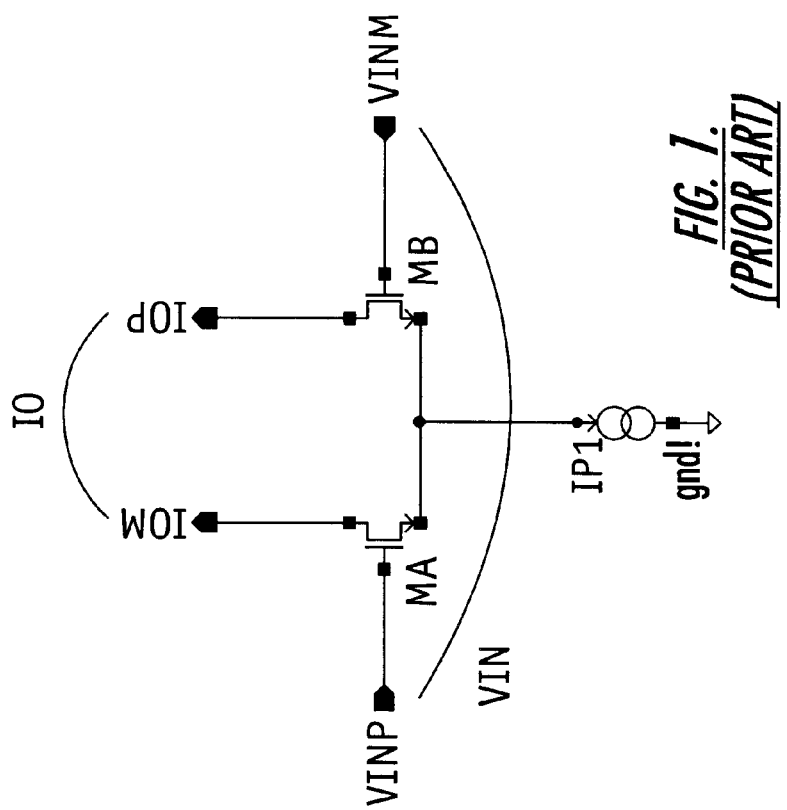
Figure 3:
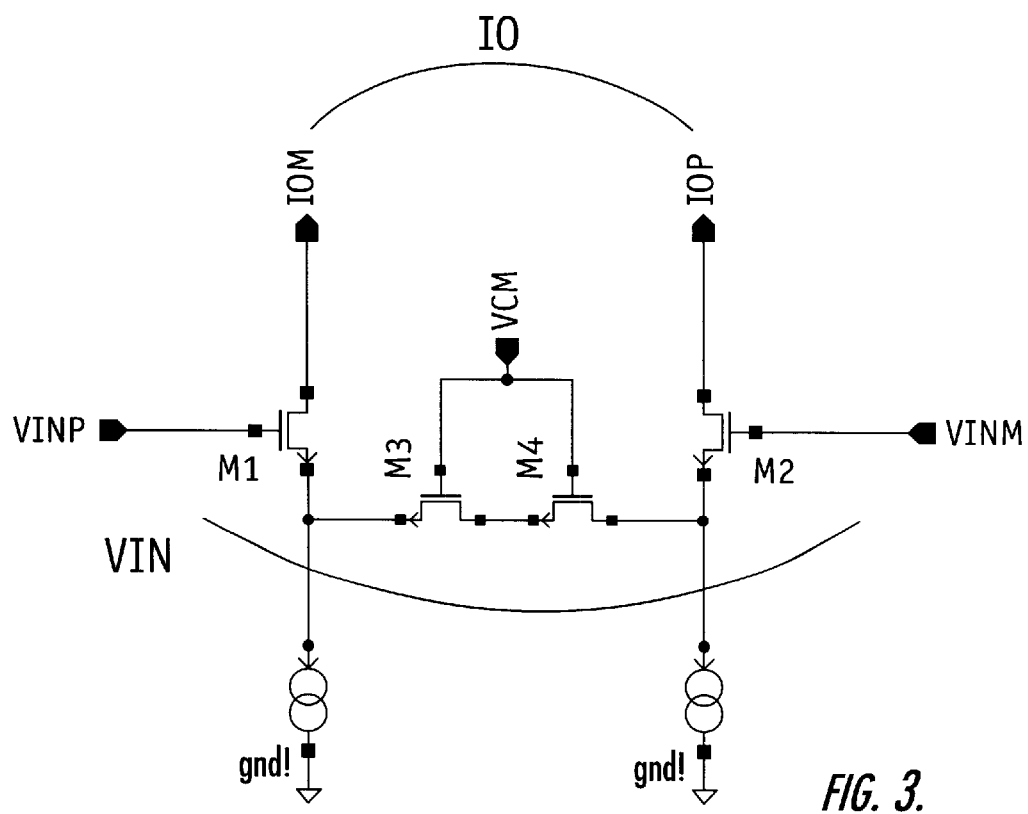
FIG. 3 is a basic scheme of a MOS transconductor according to a first embodiment of the present invention.

With reference to FIG. 3, the following relationships may be derived:

$$gm1=gm2=u*Cox*W1/L1*Vod \quad (5)$$

$$qds3=gds4=u*Cox*W3/L3*Vod \quad (6)$$

Replacing R with 1/gds in equation (3), we obtain:

$$gm = gm1/(1+gm1/gds3)$$
$$= gm1/(1+W1/L1/(W3/L3)) \quad (7)$$

The transconductance stage varies linearly with the transconductance of the transistor M1 of the differential input pair. Therefore, it is possible to considerably extend the trimming range of the transconductor for a certain permitted maximum distortion.

For instance, supposing that compatibly with the linearity specifications, the overdrive voltage Vod of the circuit is programmable in the 1–3 range using a structure of the invention as that shown in FIG. 3, with gm=qds3. The same distortion limit may be satisfied with an overdrive voltage Vodnew=½*Vod. In this way, it is possible to program the overdrive, and thus the transconductance stage within a range 0.5–3, practically doubling the trimming range.

Figure 4:
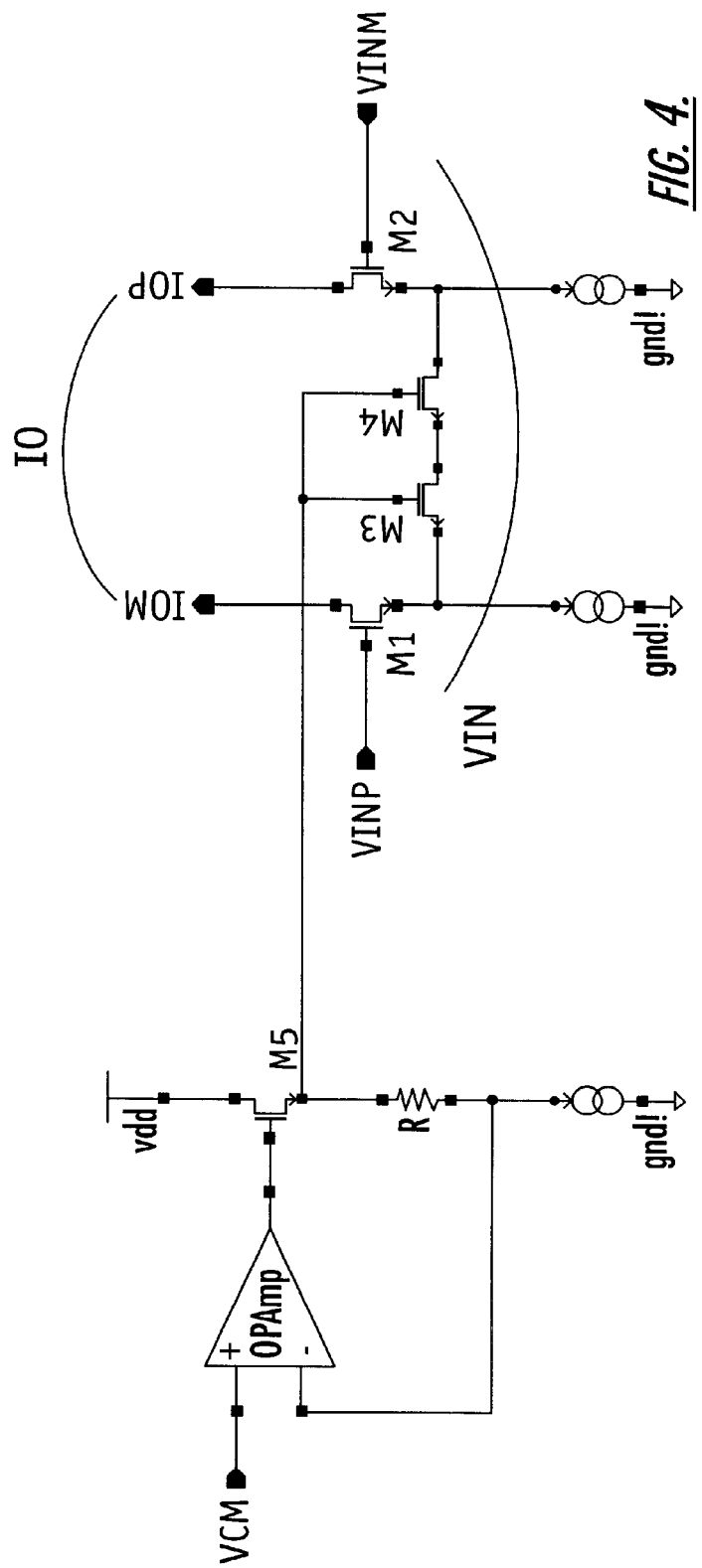
FIG. 4 is a basic scheme of a MOS transconductor according to an alternative embodiment of the present invention.

FIG. 4 relates to an alternative embodiment of the invention. The following equations may be derived:

$$gm1=gm2=u*Cox*W1/L1*Vod \quad (8)$$

$$gds3 = gds4$$
$$= u*Cox*W3/L3*(Vod+k*Vod\wedge 2) \quad (9)$$

Replacing R with 1/gds in equation (3), we have:

$$gm = gm1/(1+gm1/gds3)$$
$$= gm1/(1+W1/L1/(W3/L3)*1/(1+k*Vod)) \quad (10)$$

If the resistance had a zero value (k=0), the transconductance stage would vary linearly with the transconductance of the transistor M1 of the differential input pair. This maintains a constant degeneration ratio (gm1/gds3) upon the varying of the gm value. By introducing the term (k*Vod^2) in equation (9), it is possible to have a degeneration ratio which decreases upon the increasing of the overdrive voltage.

Consequently, it is possible to considerably extend the trimming range of the transconductor for a certain admissible value of maximum distortion. The gate voltage of the transistors that form the resistive line is generated by injecting a current proportional to the bias current of the differential pair M1–M2 through the resistance R of the dedicated bias circuit. One of the terminals of the resistance R is kept at the voltage VCM by the reaction loop formed by the MOS transistor M5, the operational amplifier OpAmp, and the resistance R itself.

The other terminal of the resistance R is connected to the source of the transistor M5 and is connected to the gate of the MOS transistors M3 and M4 functioning in the triode region. The triode region forms the degeneration resistive line of the differential pair of transistors. The voltage present on the source of the MOS transistor M5 is coupled to the gate of the MOS transistors M3, M4 operating in the triode region that constitute form the degeneration resistive line of the differential pair.

That which is claimed is:

1. A transconductor comprising:
    a differential stage comprising
        a pair of input transistors,
        a resistive line of degeneration connected between respective first conduction terminals of said pair of input transistors, said resistive line of degeneration comprising one or more transistors connected in series, a control terminal of each transistor being coupled to a first voltage reference at least equal to a common mode voltage of said differential stage, and said one or more transistors being biased to operate in a triode region, and
        a pair of bias current generators, each bias current generator being coupled between a first conduction terminal of a respective input transistor and a second voltage reference.

2. A transconductor according to claim 1, wherein the first voltage reference is equal to the common mode voltage of said differential stage plus a voltage equal to a product of a design parameter constant and a square of an overdrive voltage of said input transistors.

3. A transconductor according to claim 2, wherein each transistor of said resistive line is biased with a voltage equal to the sum of the overdrive voltage of said input transistors and the product of the design parameter and the square of the overdrive voltage.

4. A transconductor according to claim 3, wherein each transistor of said resistive line comprises a MOS transistor, and a ratio between a transconductance gain of the transconductor and a drain-source resistance of each MOS transistor increases with an increase in the transconductance gain for incrementing a trimming range of the transconductor.

5. A transconductor according to claim 1, further comprising a bias circuit connected to said one or more transistors of said resistive line.

6. A transconductor according to claim 5, wherein said bias circuit comprises:
    an operational amplifier including a non-inverting input coupled to the common mode voltage of said differential stage;
    a transistor having a control terminal connected to an output of said operational amplifier, said transistor having the same characteristics as said pair of input transistors;
    a resistor connected between a conduction terminal of said transistor and an inverting input of said operational amplifier; and
    a bias current generator connected in common to said resistor and to the inverting input of said operational amplifier.

7. A transconductor according to claim 5, wherein said bias circuit is connected to the control terminal of each transistor of said resistive line.

8. A transconductor according to claim 6, wherein said bias current generator generates a current proportional to the bias current generated by said pair of bias current generators for said differential stage.

9. A transconductor comprising:
    a differential stage comprising
        a pair of input transistors,
        one or more transistors connected in series between respective first conduction terminals of said pair of input transistors, and operating in a triode region, and
        at Least one bias current generator connected to said pair of input transistors.

10. A transconductor according to claim 9, wherein a control terminal of each transistor of said one or more transistors is coupled to a first voltage reference at least equal to a common mode voltage of said differential stage.

11. A transconductor according to claim 9, wherein said at least one bias current generator comprises a pair of bias current generators, each bias current generator being coupled to a first conduction terminal of a respective input transistor.

12. A transconductor according to claim 10, wherein the first voltage reference is equal to the common mode voltage of said differential stage plus a voltage equal to a product of a design parameter constant and a square of an overdrive voltage of said input transistors.

13. A transconductor according to claim 9, wherein each transistor of said one or more transistors is biased with a voltage equal to a sum of an overdrive voltage of said input transistors and a product between a design parameter constant and a square of an overdrive voltage of said input transistors.

14. A transconductor according to claim 13, wherein each transistor of said one or more transistors comprises a MOS transistor, and a ratio between a transconductance gain of the transconductor and a drain-source resistance of each MOS transistor increases with an increase in the transconductance gain for incrementing a trimming range of the transconductor.

15. A transconductor according to claim 9, further comprising a bias circuit connected to said one or more transistors.

16. A transconductor according to claim 15, wherein said bias circuit comprises:
   an operational amplifier including a non-inverting input coupled to a common mode voltage of said differential stage;
   a transistor having a control terminal connected to an output of said operational amplifier;
   a resistor connected between a conduction terminal of said transistor and an inverting input of said operational amplifier; and
   a bias current generator connected in common to said resistor and to the inverting input of said operational amplifier.

17. A transconductor according to claim 16, wherein characteristics of said transistor are equal to characteristics of said pair of input transistors.

18. A transconductor according to claim 15, wherein said bias circuit is connected to a control terminal of each transistor of said one or more transistors.

19. A transconductor according to claim 16, wherein said bias current generator generates a current proportional to the bias current generated by said at least one bias current generator for said differential stage.

20. A method for operating a transconductor comprising a differential stage comprising a pair of input transistors, the method comprising:
   operating one or more transistors in a triode region and which are connected in series between respective first conduction terminals of the pair of input transistors; and
   biasing the pair of input transistors.

21. A method according to claim 20 further comprising providing a first voltage reference at least equal to a common mode voltage of the differential stage to a control terminal of each transistor of the one or more transistors.

22. A method according to claim 20, wherein biasing comprises biasing each respective input transistor.

23. A method according to claim 21, wherein the first voltage reference is equal to the common mode voltage of the differential stage plus a voltage equal to a product of a design parameter constant and a square of an overdrive voltage of the input transistors.

24. A method according to claim 20, wherein each transistor of the one or more transistors comprises a MOS transistor; and a ratio between a transconductance gain of the transconductor and a drain-source resistance of the MOS transistors increases with an increase in the transconductance gain for incrementing a trimming range of the transconductor.

25. A method according to claim 20, further comprising connecting a bias circuit to the one or more transistors.

26. A method according to claim 25, wherein the bias circuit comprises:
   an operational amplifier including a non-inverting input coupled to a common mode voltage of the differential stage;
   a transistor having a control terminal connected to an output of the operational amplifier;
   a resistor connected between a conduction terminal of the transistor and an inverting input of the operational amplifier; and
   a bias current generator connected in common to the resistor and to the inverting input of the operational amplifier.

27. A method according to claim 25, wherein characteristics of the transistor are equal to characteristics of the pair of input transistors.

28. A transconductor according to claim 26, wherein the bias current generator of the bias circuit generates a current proportional to the bias current generated by the at least one bias current generator of the differential stage.

* * * * *

UNITED STATES PATENT AND TRADEMARK OFFICE
CERTIFICATE OF CORRECTION

PATENT NO.    : 6,271,688 B1
DATED         : August 7, 2001
INVENTOR(S)   : Stefano Marchese, Giacomino Bollati, Maurizio Malfa and Pierandrea Savo It is certified that error appears in the above-identified patent and that said Letters Patent is hereby corrected as shown below:

<u>Title page,</u>
Item [30], Foreign Application Priority Data,
Delete "Jul. 17, 1999" insert -- Jun. 17, 1999 --

<u>Column 3,</u>
Line 20, delete "gm=qds3." insert -- gm=gds3. --
Line 65, delete "that constitute form the degeneration resistive" insert -- that form the degeneration resistive --

<u>Column 6,</u>
Line 47, delete "A transconductor according to" insert -- A method according to --

Signed and Sealed this

Sixteenth Day of April, 2002

*Attest:*

*Attesting Officer*

JAMES E. ROGAN
*Director of the United States Patent and Trademark Office*